United States Patent
Takahashi et al.

(10) Patent No.: US 7,460,392 B2
(45) Date of Patent: Dec. 2, 2008

(54) SEMICONDUCTOR MEMORY DEVICE AND SEMICONDUCTOR INTEGRATED CIRCUIT

(75) Inventors: Yasuhiko Takahashi, Higashiyamato (JP); Takayuki Tanaka, Kimitsu (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 11/979,128

(22) Filed: Oct. 31, 2007

(65) Prior Publication Data

US 2008/0068877 A1    Mar. 20, 2008

Related U.S. Application Data

(62) Division of application No. 11/522,904, filed on Sep. 19, 2006, now Pat. No. 7,310,279, which is a division of application No. 10/722,461, filed on Nov. 28, 2003, now Pat. No. 7,110,283.

(30) Foreign Application Priority Data

Nov. 29, 2002    (JP)    .............................. 2002-347998

(51) Int. Cl.
   *G11C 11/00*    (2006.01)
(52) U.S. Cl. ...................... 365/156; 365/154
(58) Field of Classification Search .................. 365/156
See application file for complete search history.

(56) References Cited

U.S. PATENT DOCUMENTS

| | | |
|---|---|---|
| 4,984,204 A | 1/1991 | Sato et al. |
| 5,020,028 A | 5/1991 | Wanlass |
| 5,376,814 A | 12/1994 | Lee |
| 5,398,200 A | 3/1995 | Mazure et al. |
| 5,453,949 A | 9/1995 | Wiedmann et al. |
| 5,670,803 A | 9/1997 | Beilstein et al. |
| 5,771,190 A | 6/1998 | Okamura |
| 5,859,799 A | 1/1999 | Matsumoto et al. |
| 6,104,654 A | 8/2000 | Spence |
| 6,207,998 B1 | 3/2001 | Kawasaki et al. |
| 6,344,992 B1 | 2/2002 | Nakamura |
| 6,411,560 B1 | 6/2002 | Tanizaki et al. |
| 6,434,040 B1 | 8/2002 | Kim et al. |
| 6,442,060 B1 | 8/2002 | Leung et al. |
| 6,483,739 B2 | 11/2002 | Houston |
| 6,549,450 B1 | 4/2003 | Hsu et al. |

(Continued)

FOREIGN PATENT DOCUMENTS

JP    04-168694    6/1992

(Continued)

*Primary Examiner*—Son L Mai
(74) *Attorney, Agent, or Firm*—Antonelli, Terry, Stout & Kraus, LLP.

(57) ABSTRACT

In a semiconductor memory device, third and fourth transistors are configured as a vertical structure. The third transistor is laminated over a first transistor, and the fourth transistor is laminated over a second transistor, whereby a reduction in cell area is achieved. A voltage, which is set on the condition that the difference between a source potential applied to each of the first and second transistors and the potential of a select level of a word line becomes greater than or equal to a threshold voltage of each of the third and fourth transistors, is supplied to a source electrode of each of the first and second transistors, to thereby perform "0" write compensation.

6 Claims, 14 Drawing Sheets

U.S. PATENT DOCUMENTS

| | | |
|---|---|---|
| 6,584,030 B2 | 6/2003 | Marr |
| 6,741,493 B1 | 5/2004 | Christensen et al. |
| 6,826,074 B2 | 11/2004 | Yamauchi |
| 6,903,411 B1 | 6/2005 | Chyan et al. |
| 6,903,962 B2 | 6/2005 | Nii |
| 6,954,371 B2 | 10/2005 | Hokari et al. |
| 7,126,868 B2 | 10/2006 | Mizuno et al. |
| 2001/0033511 A1 | 10/2001 | Saito et al. |
| 2002/0003244 A1 | 1/2002 | Tooher et al. |
| 2006/0268626 A1* | 11/2006 | Hamzaoglu et al. .... 365/189.04 |
| 2008/0025109 A1* | 1/2008 | Lee ....................... 365/189.05 |

FOREIGN PATENT DOCUMENTS

JP   07-057476   3/1995

* cited by examiner

FIG. 5
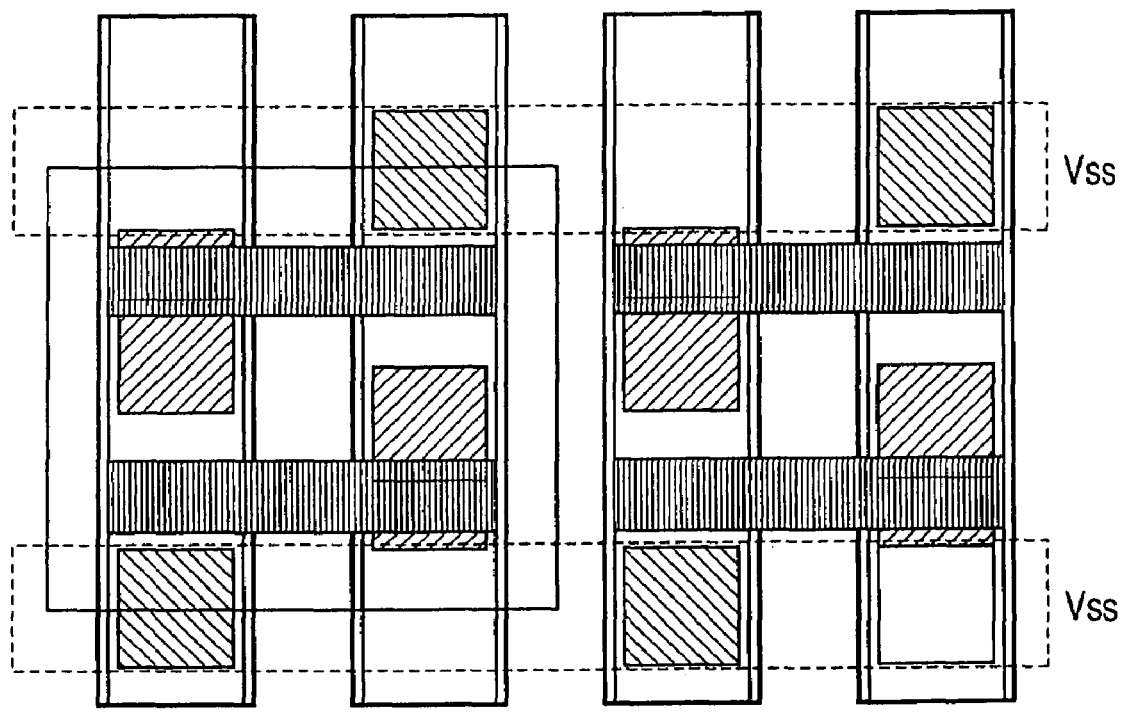
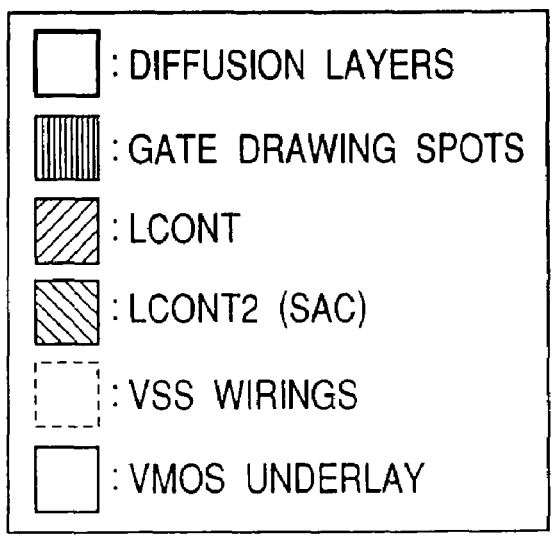

SEMICONDUCTOR MEMORY DEVICE AND SEMICONDUCTOR INTEGRATED CIRCUIT

This is a divisional application of U.S. application Ser. No. 11/522,904, filed Sep. 19, 2006, U.S. Pat. No. 7,310,279 which, in turn, is a divisional of U.S. application Ser. No. 10/722,461, filed Nov. 28, 2003 (now U.S. Pat. No. 7,110, 283), and the entire disclosures of which are hereby incorporated by reference.

BACKGROUND OF THE INVENTION

The present invention relates to a semiconductor memory device and to a technology that is effective when applied to a semiconductor memory in which static memory cells are arranged.

In a semiconductor memory device of the type used, for example, in a semiconductor integrated circuit, a latch circuit for storing and retaining data comprises n channel type MOS transistors and their load elements. A signal input/output terminal of the latch circuit and its corresponding bit line are connected via an access transistor. The access transistor is normally configured as an n channel type MOS transistor. However, when an n channel type MOS transistor is used as the access transistor, the cell current at the time of a read operation becomes small according to the threshold voltage of the n channel type MOS transistor, its operating speed becomes slow and the speed of writing of data on the high level side becomes slow. Therefore, it has been proposed to use a semiconductor memory device wherein access transistors are configured as p channel MOS transistors (e.g., see the below-listed Patent Documents 1 and 2). In a circuit provided with p channel MOS transistors serving as access transistors, the potential of a storage node, which is stepped or pulled down by the corresponding access transistor, extends to a potential higher than ground potential (power supply VSS on the low potential side) by the threshold voltage of the access transistor. When this potential is higher than the reverse threshold voltage of a latch circuit, the writing of data (or its rewriting) cannot be performed. Therefore, there is a known technique wherein a terminal different from the terminal used for supply of a normal power supply potential GND on the low potential side is provided, and a potential higher by a predetermined level than the select level of a word line is supplied to that terminal to thereby make it possible to detect low level data of each bit line by means of a latch circuit, even if the potential of a storage node is reduced by the threshold voltage of the access transistor during a write operation, whereby the writing and rewriting of data can be reliably performed.

[Patent Document 1]
Japanese Unexamined Patent Publication No. Hei 9(1997)-231765
[Patent Document 2]
Japanese Unexamined Patent Publication No. Hei 4(1992)-168694

SUMMARY OF THE INVENTION

When a p channel type MOS transistor is used for each access transistor of a memory cell, a node potential remains upon writing of a logical value "0", so that the write operation becomes unstable. Thus, the supply of a voltage higher by a predetermined level than the normal power supply potential on the low potential side is effective, as indicated in the technology described in the Patent Document 1. According to the Patent Document 1, however, the cell area becomes relatively large because the access transistor is formed in a bulk layer. As in a memory cell 1 shown in FIG. 1 of the Patent Document 1, for example, load resistors R11 and R12 can be omitted from a memory cell that is formed of four transistors Q11 through Q14 and two load resistors R11 and R12. In such a circuit configuration, however, the cell read current and the leakage current are proportional to each other, though the area of the memory cell becomes small, so that high speed operation and a low leakage condition of the memory become incompatible. That is, when the threshold voltage is lowered and a sufficient gate-to-source voltage Vgs is ensured for the purpose of high speed operation, a large standby current flows. When the threshold voltage is made high and a drain-to-source voltage Vds is lowered in reverse, a small read current flows, and, hence a low speed operation is provided.

An object of the present invention is to provide a technique for achieving a reduction in cell area and the appropriateness of writing a logical value "0".

Another object of the present invention is to provide a technique for achieving a reduction in standby current and an increase in operating speed.

The above, other objects and novel features of the present invention will become apparent from the description provided in the present Specification and from the accompanying drawings.

Summaries of representative aspects of the invention disclosed in the present application will be described in brief as follows:

In accordance with the present invention, a semiconductor memory device has a first bit line for transferring data; a second bit line having a relationship of complementary potential levels with respect to the first bit line; a storage section in which a drain electrode of a first transistor and a gate electrode of a second transistor are connected to each other to form a first node, and a drain electrode of the second transistor and a gate electrode of the first transistor are connected to each other to form a second node; a p channel type third transistor that is capable of connecting the first node to the first bit line in accordance with the voltage level of a word line; a p channel type fourth transistor that is capable of connecting the second node to the second bit line in accordance with the voltage level of the word line; and a power supply circuit that is capable of supplying a voltage, which is set on the condition that a difference between a source potential applied to each of the first and second transistors and a potential of a select level of the word line becomes greater than or equal to the threshold voltage of each of the third and fourth transistors, to a source electrode of each of the first and second transistors, wherein the third and fourth transistors are configured as a vertical structure, the third transistor is laminated over the first transistor, and the fourth transistor is laminated over the second transistor.

According to the above-described arrangement, the third and fourth transistors are configured as a vertical structure, the third transistor is laminated over the first transistor, and the fourth transistor is laminated over the second transistor. This achieves a reduction in cell area. The power supply circuit supplies the voltage, which is set on the condition that the difference between the source potential applied to each of the first and second transistors and the potential of the select level of the word line becomes greater than or equal to the threshold voltage of each of the third and fourth transistors, to the source electrode of each of the first and second transistors. Owing to this, "0" write compensation is carried out. This achieves the appropriateness of writing a logical value "0".

At this time, the potential of the select level of the word line can be set as a ground level. Further, the power supply circuit includes a fifth transistor connected to the source electrodes of the first and second transistors and ground, and an error amplifier for determining a difference between a reference voltage supplied thereto and the source potential applied to each of the first and second transistors for controlling the on resistance of the fifth transistor, based on the difference.

A semiconductor memory device is configured which comprises a first memory cell area in which first memory cells are disposed in an array, a second memory cell area in which second memory cells different in structure from the first memory cells are disposed in an array, and a peripheral circuit is shared between the first memory cell area and the second memory cell area. Each of the first memory cells comprises a storage section including an n channel type first MOS transistor and an n channel type second MOS transistor connected to each other, a p channel type third MOS transistor that is capable of connecting a drain electrode of the first MOS transistor and a gate electrode of the second MOS transistor to a first bit line, and a p channel type fourth MOS transistor that is capable of connecting a drain electrode of the second MOS transistor and a gate electrode of the first MOS transistor to the first bit line. The third and fourth MOS transistors can be configured as a vertical structure, the third MOS transistor can be laminated over the first MOS transistor, and the fourth MOS transistor can be laminated over the second MOS transistor. Each of the second memory cells includes a storage section, in which a first inverter comprising a p channel type fifth MOS transistor and an n channel type sixth MOS transistor, both connected in series, and a second inverter comprising a p channel type seventh MOS transistor and an n channel type eighth MOS transistor both connected in series, are connected in a loop form. The fifth and seventh MOS transistors are configured as a vertical structure, the fifth MOS transistor is laminated over the sixth MOS transistor, and the seventh MOS transistor is laminated over the eighth MOS transistor. Thus, a reduction in cell area is achieved.

At this time, the array pitch between adjacent bit lines in the first memory cell array and the array pitch between adjacent bit lines in the second memory cell array are made equal to each other, to thereby make it possible to share the bit lines between the first memory cell array and the second memory cell array.

When the bit line array pitches are different from each other between the first memory cell array and the second memory cell array, a selector for selectively connecting the bit lines in the first and second memory cell arrays may preferably be interposed between the bit lines of the first memory cell array and the bit lines of the second memory cell array.

There is a semiconductor memory device which includes a memory cell provided at a point where a word line and bit lines intersect, a column selection switch for selectively connecting the bit lines to a data line, a bit line precharge circuit for precharging each of the bit lines to a predetermined level, and high voltage precharge means that is capable of precharging the bit line selected by the column selection switch at a voltage of a level higher than a precharge voltage outputted by the bit line precharge circuit.

According to the above arrangement, the high voltage precharge means performs precharge at the voltage of a level higher than the precharge voltage produced by the bit line precharge circuit. This achieves a reduction in a standby current and a speeding up of reading and writing.

In addition, the semiconductor memory device includes a write amplifier connected to the bit lines via the column selection switch, which is capable of writing data into the corresponding memory cell through the bit line selected by the column selection switch. The high voltage precharge means can be contained in the write amplifier.

The memory device can comprise a storage section including an n channel type first MOS transistor and an n channel type second MOS transistor connected to each other, a p channel type third MOS transistor that is capable of connecting a drain electrode of the first MOS transistor and a gate electrode of the second MOS transistor to a first bit line, and a p channel type fourth MOS transistor that is capable of connecting a drain electrode of the second MOS transistor and a gate electrode of the first MOS transistor to the first bit line.

The third and fourth MOS transistors are configured as a vertical structure, the third MOS transistor is laminated over the first MOS transistor, and the fourth MOS transistor is laminated over the second MOS transistor, whereby a reduction in cell area is achieved.

Also, the semiconductor memory device can include a power supply circuit that is capable of supplying a voltage, which is set on the condition that a difference between a source potential applied to each of the first and second MOS transistors and a potential of a select level of the word line becomes greater than or equal to a threshold voltage of each of the third and fourth MOS transistors, to a source electrode of each of the first and second MOS transistors.

Further, each of the third and fourth MOS transistors can be set so as to retain data on the high level side in the storage section in a state in which a potential opposite in polarity to a potential for turning on a channel is being applied between a gate and source thereof. When the bit lines are boosted or stepped up, the potential of the corresponding word line is relatively reduced. Hence, only some of all of non-selected memory cells on the same bit line are placed in a selected state so that a large current is used up. However, if the data is retained in the state in which a potential opposite in polarity to the potential for turning on the channel is being applied between the gate and source, as described above, then the leakage current does not need to increase even if the potential of each bit line rises.

The film thickness of each MOS transistor employed in a semiconductor integrated circuit often is generally limited to two types. In order to form high-withstand MOS transistors for the internal circuit within its range, MOS transistors identical in type to high-withstand MOS transistors as used in an input/output circuit may preferably be used at spots where the voltage of the level higher than the precharge voltage outputted by the precharge circuit is used.

BRIEF DESCRIPTION OF THE DRAWINGS

FIG. 5 is a layout plan view illustrating a bulk-configured cell intended for comparison with the 4T cell;

DETAILED DESCRIPTION OF THE PREFERRED EMBODIMENTS

Figure 1:
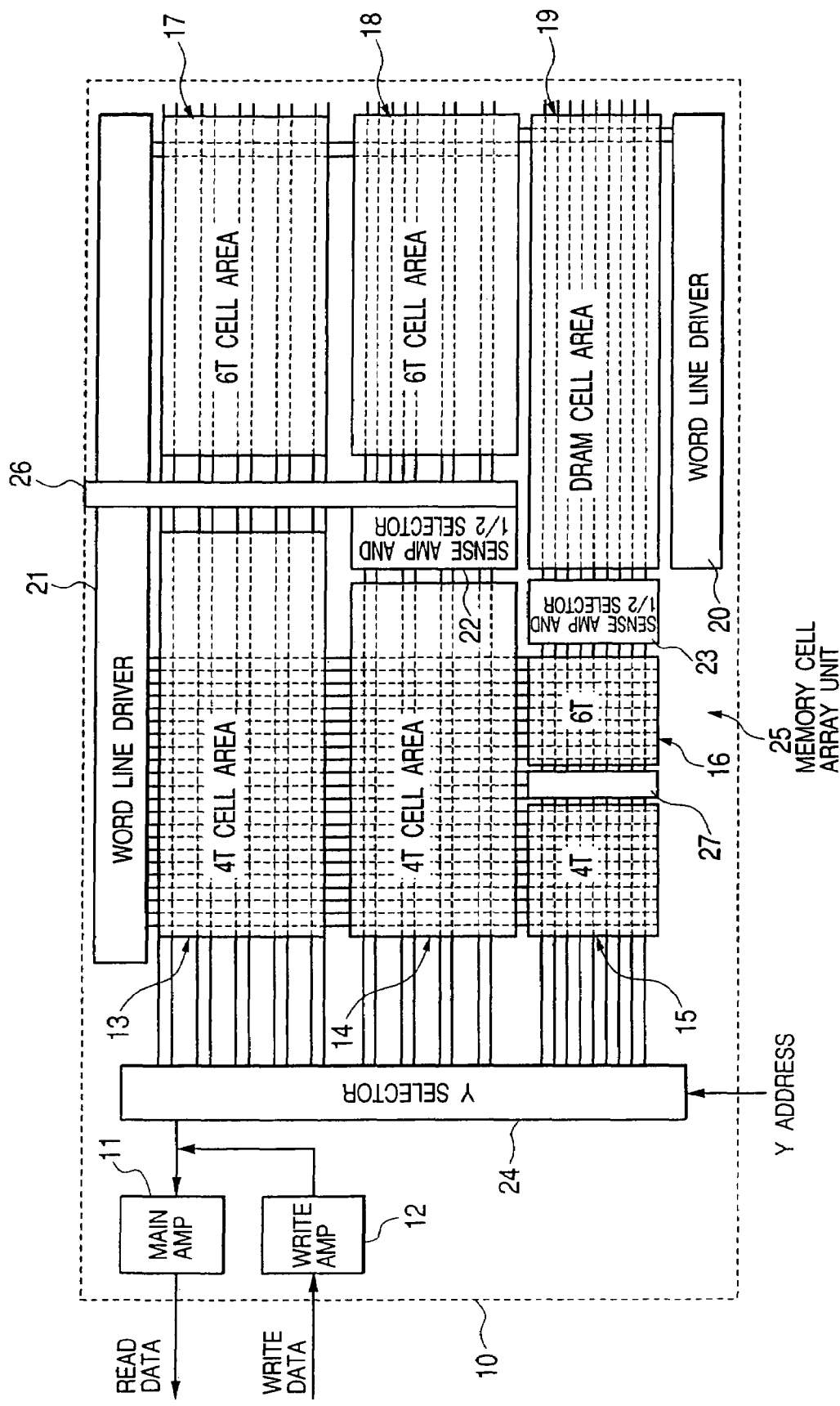
FIG. 1 is a block diagram showing a configurational example of a principal part of a mixed semiconductor memory device illustrated as one example of a semiconductor memory device according to the present invention.

A mixed semiconductor memory device representing one example of a semiconductor memory device according to the present invention is shown in FIG. 1. Although the invention is not restricted in particular, the mixed semiconductor memory device 10 shown in FIG. 1 is formed over one semiconductor substrate, such as a monocrystal silicon substrate or the like, by known semiconductor integrated circuit manufacturing technology.

Although the invention is not restricted in particular, the mixed semiconductor memory device 10 includes a memory cell array unit 25, word drivers 20 and 21, a Y (column) selector 24, a main amplifier 11 and a write amplifier 12.

The memory cell array unit 25 comprises including a plurality of word lines, a plurality of bit lines respectively disposed so as to intersect the word lines, and a plurality of memory cells respectively disposed at spots where the word lines and the bit lines intersect respectively. The memory cell array unit is formed with a 4T cell area 13, a 4T cell area 14, a 4T cell area 15, a 6T cell area 16, a 6T cell area 17, a 6T cell area 18 and a DRAM cell area 19. A plurality of the memory cells formed by combinations of four transistors are respectively provided in the 4T cell areas 13, 14 and 15 in an array form. A plurality of the memory cells respectively formed by combinations of six transistors are respectively provided in the 6T cell areas 16, 17 and 18 in an array form. A plurality of dynamic memory cells are provided in the DRAM cell area 19 in an array form.

A power supply wiring 26 is provided between the 4T cell areas 13 and 14 and the 6T cell areas 17 and 18. A power supply wiring 27 is provided between the 4T cell area 15 and the 6T cell area 16. The memory cells (called "6T cells") formed by the combinations of the six transistors need to be supplied with a power supply VDD on the high potential side, as distinct from the memory cells (called "4T cells") formed by the combinations of the four transistors. The supply of the power supply VDD on the high potential side to the 6T cells is performed via the power supply wirings 26 and 27.

Since the 4T memory cell can be made smaller than the 6T memory cell in the chip occupied area, the array pitch between the adjacent bit lines can also be narrowed correspondingly. A bit line array pitch in the 4T cell area 14 is set to ½ of a bit line array bit in the 6T cell area 18. Therefore, a sense amplifier and ½ selector 22 is disposed between the 4T cell area 14 and the 6T cell area 18. The bit lines in the 4T cell area 14 and the bit lines in the 6T cell area 18 are respectively connected in the form of 2:1. That is, one bit line in the 6T cell area 18 is connected to the two bit lines in the 4T cell area 14 via the ½ selector. The operation of the ½ selector can be controlled based on a column address signal. The sense amplifier in the sense amplifier and ½ selector 22 amplifies a signal read from the 4T cell area 14 to a level writable into the 6T cell area 18 and amplifies a signal read from the 6T cell area 18 to a level rewritable into the 4T cell area 14. The sense amplifier in the sense amplifier and ½ selector 22 is connected to the Y selector 24 on the 4T cell area 14 side, where a bit line corresponding to a column address is selected. Incidentally, contrivances such as separation of the bit lines on the 4T cell area 14 side from the sense amplifier, execution of writing into the 4T cell area 14 side by pulse driving are effected after sense completion by the sense amplifier for the purpose of measures taken in the 4T cell area 14.

The array pitch between the adjacent bit lines in the 4T cell area 13 is made equal to that between the adjacent bit lines in the 6T cell area 17 to thereby make common the bit lines in the 4T cell area 13 and the bit lines in the 6T cell area 17. They can be selected by the Y selector 24 in accordance with column addresses.

The relationship between the 4T cell area 15 and the 6T cell area 16 is equal to the relationship between the 4T cell area 13 and the 6T cell area 17. That is, the array pitch between the adjacent bit lines in the 4T cell area 15 is made equal to that between the adjacent bit lines in the 6T cell area 16, to thereby make common the bit lines in the 4T cell area 15 and the bit lines in the 6T cell area 16. They can be selected by the Y selector 24 in accordance with column addresses.

The word driver 21 is shared among the 4T cell areas 13, 14 and 15 and the 6T cell areas 16, 17 and 18.

The word lines in the DRAM cell area 19 are respectively driven to a select level by the dedicated word driver 20. Each of the dynamic memory cells connected to the intersecting points of the word lines and the bit lines is formed of one transistor and a charge storage capacitor. The chip occupied area thereof is smaller than that of each of the memory cells in the 4T cell area 15 and the 6T cell area 16. Correspondingly, the array pitch between the adjacent bit lines in the DRAM cell area 19 is made smaller than the bit line array pitches in the 4T cell area 15 and the 6T cell area 16. Therefore, a sense amplifier and ½ selector 23 is disposed between the DRAM cell area 19 and the 6T cell area 16 in a manner similar to one disposed between the 4T cell area 14 and the 6T cell area 18, whereby the bit lines in the DRAM cell area 19 and the 6T cell area 16 are connected in the ratio of 2:1. The operation of the ½ selector in the sense amplifier and ½ selector 23 can be controlled based on a column address signal.

Figure 2:
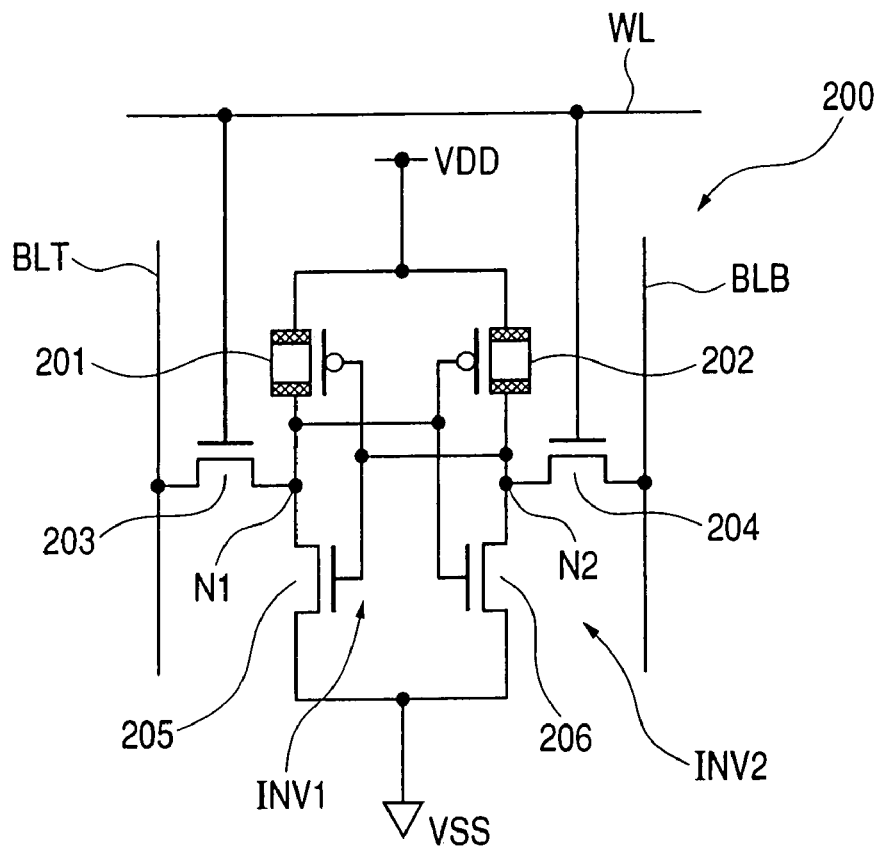
FIG. 2 is a circuit diagram illustrating a configurational example of a 6T cell included in the mixed semiconductor memory device.

A configurational example of a 6T cell 200, which is applicable to each of the 6T cell areas 16, 17 and 18, is shown in FIG. 2.

A first inverter INV1 comprising a p channel type MOS transistor 201 and an n channel type MOS transistor 205, both connected in series, and a second inverter INV2 comprising a p channel type MOS transistor 202 and an n channel type MOS transistor 206, both connected in series, are connected in a loop form to form a storage section. Source electrodes of the p channel type MOS transistors 201 and 202 are connected to a power supply VDD on the high potential side, and source electrodes of the n channel type MOS transistors 205 and 206 are connected to a power supply VSS on the low potential side. Although the invention is not restricted in particular, the power supply VSS on the low potential side is equal to a ground GND line in the present semiconductor memory device. The potential thereof is set to 0 volt.

A point where the p channel type MOS transistor 201 and the n channel type MOS transistor 205 are connected in series, is configured as a first node N1 of the storage section. The first node N1 is connected to a bit line BLT via an n channel type MOS transistor 203. A point where the p channel type MOS transistor 202 and the n channel type MOS transistor 206 are connected in series is configured as a node N2 of the storage section. The node N2 is connected to a bit line BLB via an n channel type MOS transistor 204. The bit lines BLT and BLB are provided as a complementary bit line pair for transmitting signals of complementary levels.

The n channel type MOS transistors 203 and 204 are operation-controlled by the potential of a word line WL. In the present example, when the word line WL is driven to a high level, the n channel type MOS transistors 203 and 204 are brought into conduction so that the first node N1 and the second node N2 of the storage section are respectively connected to the bit lines BLT and BLB, thus making it possible to write data into the storage section and read data from the storage section.

The p channel type MOS transistors 201 and 202 are configured as a vertical structure. As will be described later, the p channel type MOS transistor 201 is laminated over the n channel type MOS transistor 205, and the p channel type MOS transistor 202 is laminated over the n channel type MOS transistor 206, whereby a reduction in the area of the memory cell can be achieved.

While the 6T cell 200 shown in FIG. 2 has an advantage in that it is activated at high speed in a complete static operation and is low in current consumption at standby, the number of constituent elements is increased and the number of connections between the nodes is also increased. Therefore, the size per cell becomes relatively large.

Figure 3:
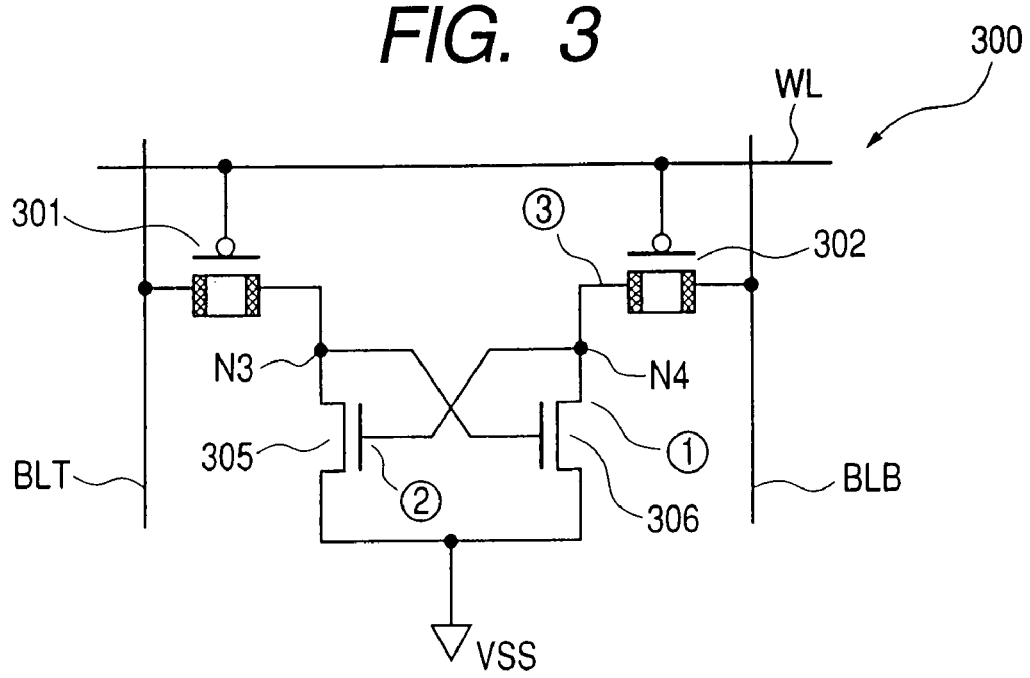
FIG. 3 is a circuit diagram depicting a configurational example of a 4T cell included in the mixed semiconductor memory device.

A configurational example of a 4T cell 300, which is applicable to each of the 4T cell areas 13, 14 and 15, is shown in FIG. 3.

The n channel type MOS transistors 305 and 306 are also referred to as drive MOSs, and they are connected to each other to constitute a storage section. Source electrodes of the n channel type MOS transistors 305 and 306 are connected to a power supply VSS on the low potential side. A point where a drain electrode of the n channel type MOS transistor 305 and a gate electrode of the n channel type MOS transistor 306 are connected to each other is configured as a first node N3 of the storage section. The first node N3 is connected to a bit line BLT via a p channel type MOS transistor 301. A point where a drain electrode of the n channel type MOS transistor 306 and a gate electrode of the n channel type MOS transistor 305 are connected to each other is configured as a second node N4 of the storage section. The second node N4 is connected to a bit line BLB via a p channel type MOS transistor 302.

The p channel type MOS transistors 301 and 302 are also referred to as transfer MOSs, and they are operation-controlled by the potential of a word line WL. In the present example, when the word line WL is driven to a low level, the p channel type MOS transistors 301 and 302 are brought into conduction so that the first node N3 and the second node N4 of the storage section are connected to their corresponding bit lines BLT and BLB, thus making it possible to write data into the storage section and read data from the storage section.

The p channel type MOS transistors 301 and 302 are configured as a vertical structure. As will be described later, the p channel type MOS transistor 301 is laminated over the n channel type MOS transistor 305, and the p channel type MOS transistor 302 is laminated over the n channel type MOS transistor 306, whereby a reduction in the area of the memory cell can be achieved.

The 4T cell 300 shown in FIG. 3 holds a high level attributable to leakage of the p channel type MOS transistors 301 and 302. Since the number of constituent elements is small and the number of nodes is also small as compared with the configuration shown in FIG. 2, the size per cell is relatively small, but a trade-off relation is established between the standby current and the operating speed of the 4T cell. When a reduction in the standby current is effected, for example, the operating speed is reduced correspondingly.

A layout of a bulk 4T cell intended for comparison with the 4T cell 300 is shown in FIG. 5. Since four transistors are constituted as bulks, the bulk 4T cell needs to provide spaces corresponding to the four MOS transistors for their underbeds or underlying bases. Since the p channel type MOS transistors and the n channel type MOS transistors exist, well separation is required. For the purpose of wiring between a p channel region and an n channel region, all wiring must go through an upper layer. At this time, contact holes (LCONT and LCONT2) for connecting diffusion layers and wiring layers are needed.

Figure 4:
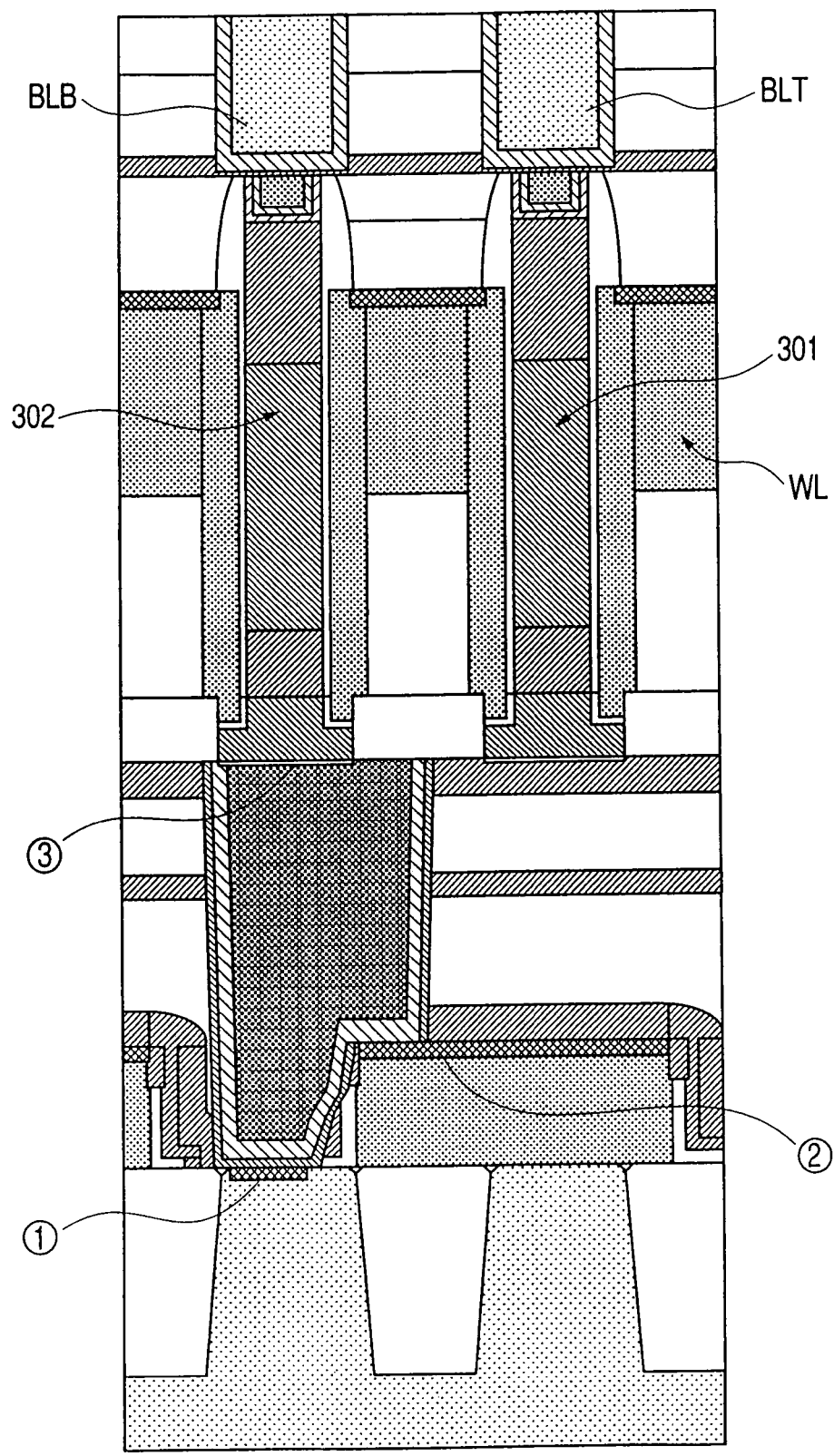
FIG. 4 is a cross-sectional view showing a principal part of the 4T cell.

A cross-section of a principal part of the 4T cell 300 is shown in FIG. 4. Incidentally, points designated at ①, ② and ③ in FIGS. 3 and 4 are provided to facilitate a corresponding identification of the electrodes of the main transistors.

Since the vertical structure-type p channel type MOS transistors 301 and 302 are provided in a form where they are laminated over the n channel type MOS transistors 305 and 306, spaces corresponding to the two MOS transistors are sufficient for underbeds or underlying bases. Since the p channel type MOS transistors 301 and 302 are of the SOI type, well separation is not necessary. Since they themselves share contacts because of the vertical structure, there is no need to provide contact holes essential to the bulk constitution.

Since the p channel type MOS transistors are used for transfer MOSs (301 and 302) in the 4T cell 300, a high level in the cell is raised to the potential of each bit line upon data writing. However, a low level enables writing only up to VSS-Vth. Here, Vth is defined as the threshold voltage of each of the transfer MOSs (301 and 302). Therefore, "0" write compensation is performed in the following manner.

Figure 6:
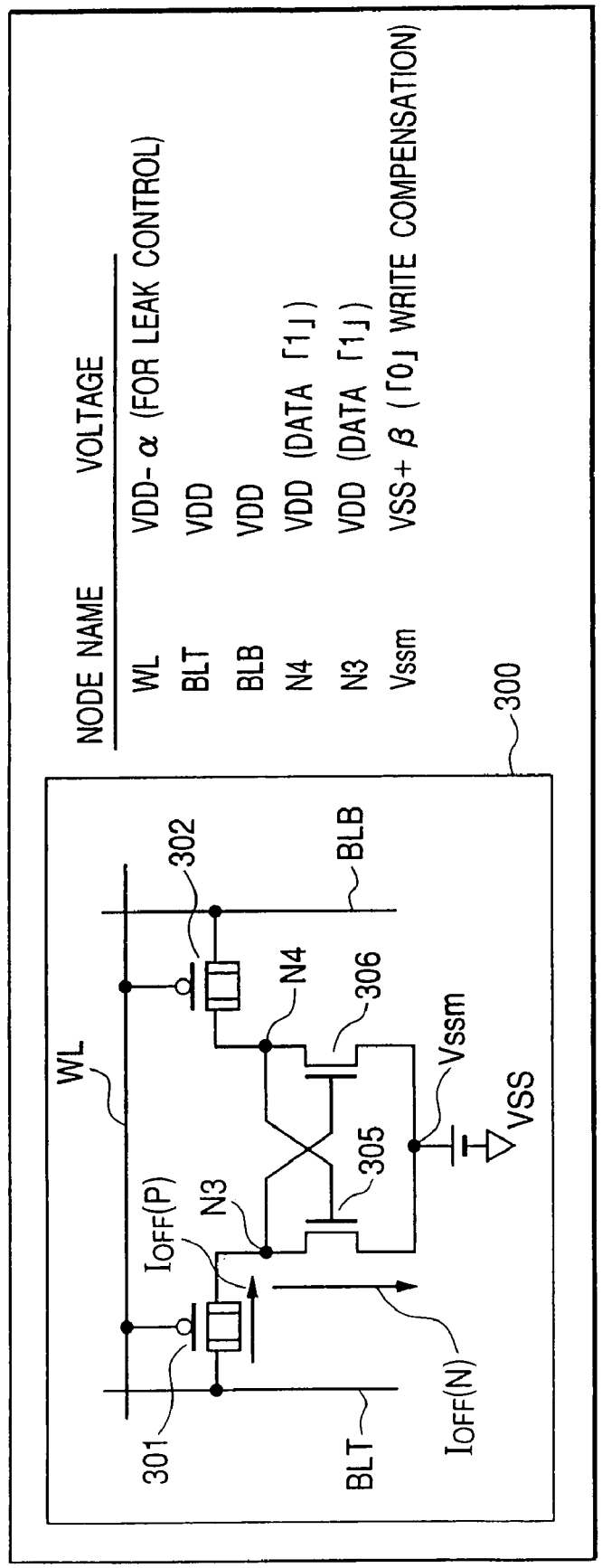
FIG. 6 is a diagram depicting the relationship between a hold state of the 4T cell and main node voltages at that time.

FIG. 6 shows the relationship between a hold state of the 4T cell 300 and main node voltages at that time.

The leakage of the p channel type MOS transistor 301 or 302 compensates for a voltage drop developed by leakage at the time of the turning off of the n channel type MOS transistor at the node N3 or N4 that is brought to a high level (logical value "1"). Therefore, the p channel type MOS transistor 301 or 302 is controlled to a very shallow on state (Vgs=α). Thus, the same current as described above flows even into the node N3 or N4 that is brought to a low level (logical value "0"). At this time, however, it flows into the low-potential power supply VSS side via the n channel MOS transistor 305 or 306 that is placed in an on state. A node Vssm potential (+β) in the hold state is generated using the above current and is used as a "0" write compensation potential.

Figure 7:
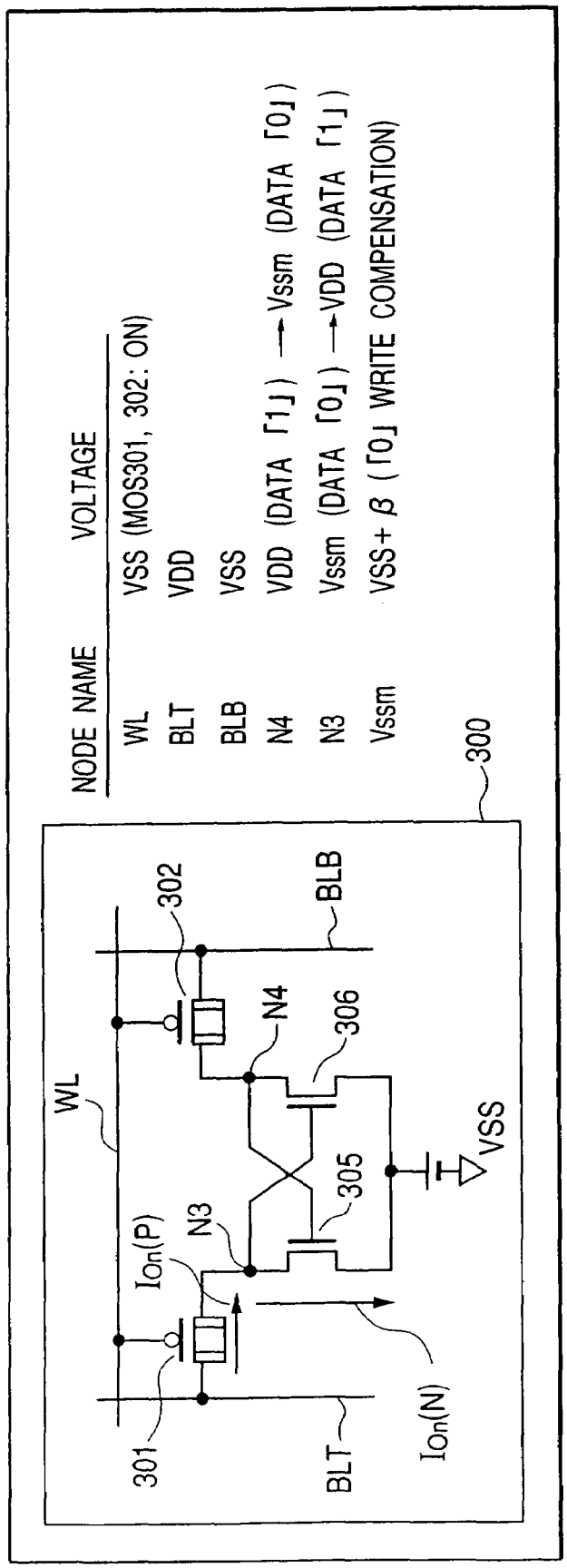
FIG. 7 is a diagram depicting the relationship between a write state of the 4T cell and main node voltages at that time.

FIG. 7 shows the relationship between a write state of the 4T cell 300 and main node voltages at that time.

Upon writing, the word line WL is brought to a low level (=VSS), so that the p channel type MOS transistors 301 and 302 are brought into conduction. Since the bit line BLT is high in level (=VDD), they are operated in a common-source configuration, with the level of the power supply VDD on the high potential side serving as a reference. However, since the potential ratio of the above transistor to the n channel type MOS transistor 305 is taken, the node N3 simply rises to about ⅓ when kept intact. Since the driving of the n channel type MOS transistor 305 becomes weak as the potential of the node N4 side decreases, it gradually rises and finally reaches the power supply VDD level on the high potential side. Since the node N4 side is initially brought to the power supply VDD level in reverse, the common-source configuration is taken. Further, the potential of the node N4 side drops rapidly because of the no load MOS transistor. However, as the potential of the node N4 side gradually approaches the Vssm level, the gate-to-source voltage Vgs is reduced, so that a source-follower operation is taken. Finally, Vgs=Vssm−Vss is achieved. Here, the level of Vssm is determined so that Vgs reaches a level greater than or equal to the threshold voltage of each of the p channel type MOS transistors 301 and 302. Consequently, "0" write compensation is carried out. Incidentally, even if a slight voltage remains at each node in some cases, any of the nodes comes to the Vssm level by the leakage of the p channel type MOS transistor 301 or 302.

Figure 8:
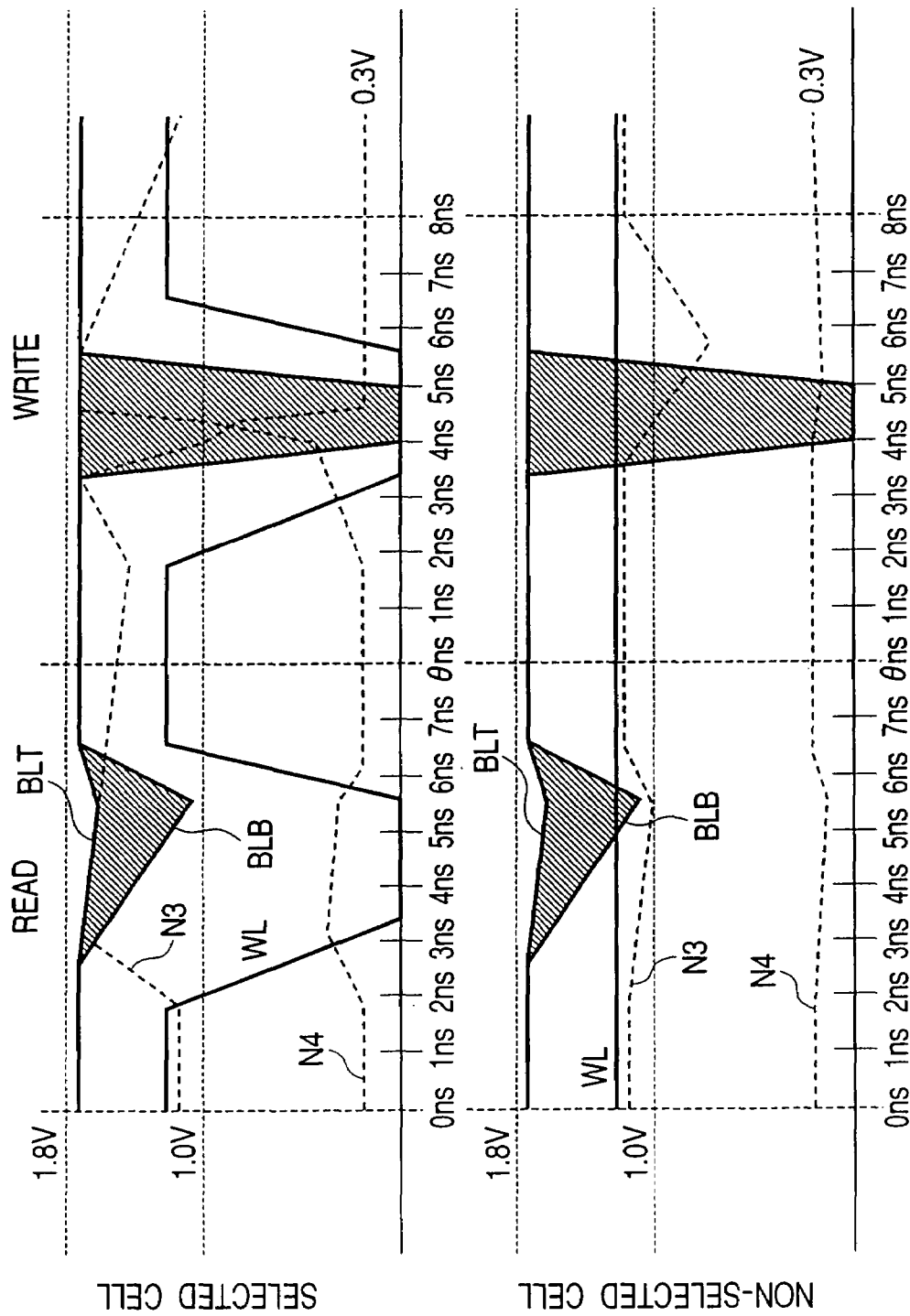
FIG. 8 is a waveform diagram illustrating main operations during reading and writing operations of the 4T cell.

FIG. 8 shows main operational waveforms at the time of reading and writing of the 4T cell 300.

In the case of a selected cell, the word line WI is driven to a low level. During a read period, the word line WL is reduced to a power supply VSS level on the low potential side so that signals at the nodes N3 and N4 are read into the bit lines BLT/BLB. During a write period, the word line WL is reduced to the power supply VSS level, so that write data is transferred to each of the nodes N3 and N4. At this time, the low level of each bit line is made higher, by the threshold voltage of each transfer MOS than the select level (power supply VSS level on the low potential side) of the word line WL, whereby "0" write compensation is performed.

Figure 9:
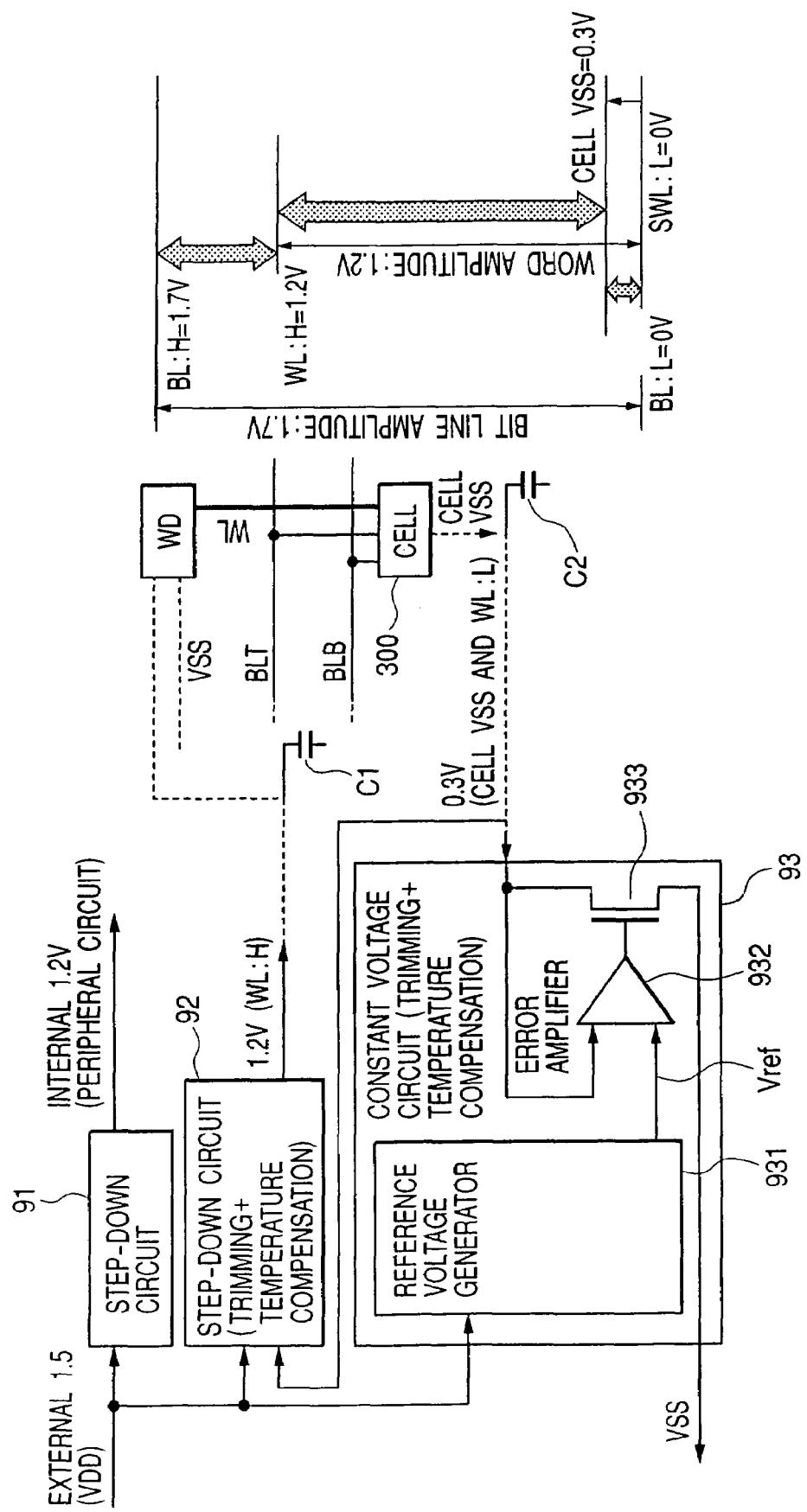
FIG. 9 is a diagram showing the relationship between various internal voltages used in a memory cell array unit.

Various internal voltages used in the memory cell array unit 25 are shown in FIG. 9.

A high level of each bit line is set to 1.7V, and a low level of each bit line is set to 0V (=VSS). A high level (non-select level) of a word line is set to 1.2V, and a low level (select level) of the word line is set to 0V (=VSS). A Vssm level (cell VSS) of the 4T cell 300 is set to 0.3V in consideration of "0" write compensation. This is determined in such a manner that Vgs becomes greater than or equal to the threshold voltage of each of the p channel type MOS transistors 301 and 302 when Vgs=Vssm−Vss. Such various voltages are obtained by stepping down a voltage supplied from outside in the following manner.

That is, a power supply voltage 1.5V (VDD) supplied from outside is stepped down by a step-down circuit 91 to thereby generate an internal 1.2V voltage to be supplied to each of the peripheral circuits. The power supply voltage 1.5V (VDD) that is supplied from the outside is stepped down by a step-down circuit 92 to thereby generate 1.2V corresponding to the high level of the word line WL. Since the generated 1.2V stabilizes a retention or hold characteristic, trimming and temperature compensation have been made. This voltage is stabilized by a parasitic capacitor C1 at a non-selected word line. Cell VDD=0.3V is stabilized by a constant voltage circuit 93 and a parasitic capacitor C2 in a memory cell array. The constant voltage circuit 93 is connected to the source electrodes of the n channel MOS transistors 305 and 306 in the 4T cell 300 and the power supply VSS on the low potential side, and serves as variable impedance means with respect to a cell current. Although the invention is not restricted in particular, the constant voltage circuit 93 comprises an n channel type MOS transistor 933 connected to the source electrodes of the n channel MOS transistors 305 and 306 in the 4T cell 300 and the power supply VSS on the low potential side, a reference voltage generator 931 for generating a reference voltage Vref, based on the power supply voltage 1.5V (VDD) supplied from the outside, and an error amplifier 932 for determining the difference between the reference voltage Vref generated by the reference voltage generator 931 and the cell VSS and for controlling the on resistance of the n channel type MOS transistor 933, based on the difference. The reference voltage generator 931 stabilizes the reference voltage Vref according to trimming and temperature compensation. That is, the reference voltage generator 931 is provided with a stable reference voltage source such as a bandgap reference, a fuse circuit capable of trimming upon testing, and a pseudo or dummy trimming circuit. Variations between lots of p channel type MOS transistors are corrected by the trimming function to thereby make it possible to achieve an improvement in yield. Owing to the dummy trimming function, the voltage level is changed according to a test command without causing a fuse to blow, thereby attempting to facilitate a write margin test.

According to the above example, the following operation and effects can be obtained.

(1) In general, the density of a memory cell is reduced in the order of the DRAM cell area, 4T cell area and 6T cell area. A random access speed is lowered in the order of the 6T cell area, 4T cell area and DRAM cell area. Thus, preferably, data that is large in amount and in which the access speed is not so greatly emphasized is stored in the DRAM area 19, and data that is high in use frequency and in need of high-speed access is stored in each of the 6T cell areas 16, 17, 18 and 4T cell areas 13, 14 and 15. The cell areas are used properly according to the demands for the access speed, the use frequency, etc. in this way to thereby obtain the maximum performance. Since the bit line is brought into conduction between the different cell areas, a copying of each of the stored data can be performed at high speed via the bit line. When, for example, the data stored in the 6T cell areas 16, 17 and 18 are transferred to the 4T cell areas 13, 14 and 15, respectively, high-speed data transfer is enabled using the bit lines that have been brought into conduction.

(2) Since the cell VDD=0.3V is formed to perform "0" write compensation, writing exceeding the limit of VSS-Vth is enabled upon writing of the low level. Also, the cell VDD=0.3V is stabilized by the constant voltage circuit 93, and the parasitic capacitor C2 in the memory cell array. The constant voltage circuit 93 is connected to the source electrodes of the n channel type MOS transistors 305 and 306 in the 4T cell 300, and the power supply VSS on the low potential side, and it serves as a variable impedance means with respect to the cell current. The constant voltage circuit 93 comprises the n channel type MOS transistor 933 that is connected to the source electrodes of the n channel MOS transistors 305 and 306 in the 4T cell 300 and the power supply VSS on the low potential side, the reference voltage generator 931 for generating the reference voltage Vref, based on the power supply voltage 1.5V VDD that is supplied from the outside, and the error amplifier 932 for determining the difference between the reference voltage Vref that is generated by the reference voltage generator 931 and the cell VSS and for controlling the on resistance of the n channel type MOS transistor 933, based on the difference, whereby the stabilization of the cell VDD=0.3V is achieved.

(3) Since the p channel MOS transistors 301 and 302 of vertical structure are applied to the transfer MOSs, and the p channel type MOS transistors 301 and 302 of vertical structure are provided in a form where they are heaped up over the n channel type MOS transistors 305 and 306, the spaces corresponding to the two MOS transistors are sufficient for the underlying bases. Since the p channel type MOS transistors 301 and 302 are of the SOI type, the well separation is not necessary. Since they themselves share contacts because of the vertical structure, there is no need to provide contact holes essential to the bulk constitution. From this point of view, the scaling down of the memory cell can be achieved.

Figure 10:
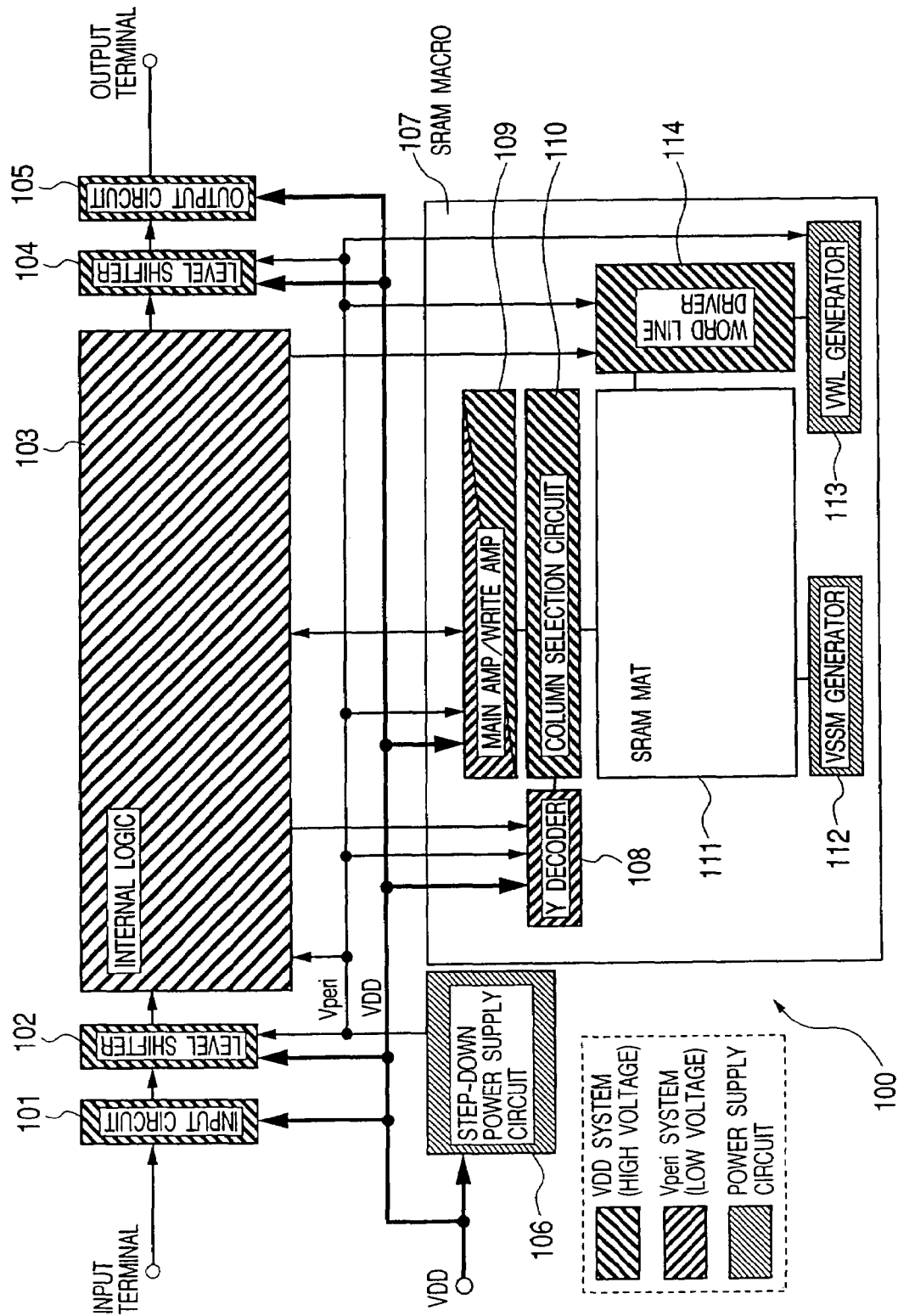
FIG. 10 is a block diagram showing a configurational example of a semiconductor integrated circuit including a semiconductor memory device according to the present invention.

A configurational example of a semiconductor integrated circuit including a semiconductor memory device according to the present invention is shown in FIG. 10.

Although the invention is not restricted in particular, the semiconductor integrated circuit 100 shown in FIG. 10 includes an input circuit 101, a level shifter 102, an internal logic 103, a level shifter 104, an output circuit 105, a step-down power supply circuit 106 and an SRAM macro 107, and it is formed over one semiconductor substrate, such as a monocrystal silicon substrate, by known semiconductor integrated circuit manufacturing technology. The input circuit 101 has the function of fetching or taking in a signal inputted via an input terminal. The level shifter 101 has the function of shifting a signal of a power supply VDD system (high voltage) on the high potential side, which is inputted via the input circuit 101, to a Vperi system (low voltage). The internal logic 103 is of a Vperi system and includes a central processing unit for effecting a predetermined logical operating process on the input signal, and peripheral circuits thereof. Upon the logical operation of the internal logic 103, the SRAM macro 107 is accessed and information stored therein is used as needed. The level shifter 104 has the function of shifting a signal (Vperi system) outputted from the internal logic 103 to the power supply VDD system on the high potential side. The output circuit 105 has the function of outputting a signal outputted from the level shifter 104 from an output terminal.

The step-down power supply circuit 106 steps down the supplied power supply VDD on the high potential side to thereby generate a voltage Vperi that is lower than the VDD level. The generated voltage Vperi is supplied to the level shifter 102, the internal logic 103, the level shifter 104 and the SRAM macro 107.

Although the invention is not restricted in particular, the SRAM macro 107 includes a Y (column) decoder 108, a main amplifier and write amplifier 109, a column selection circuit 110, an SRAM mat 111, a VSSM generator 112, a VWL generator 113 and a word line driver 114.

Figure 11:
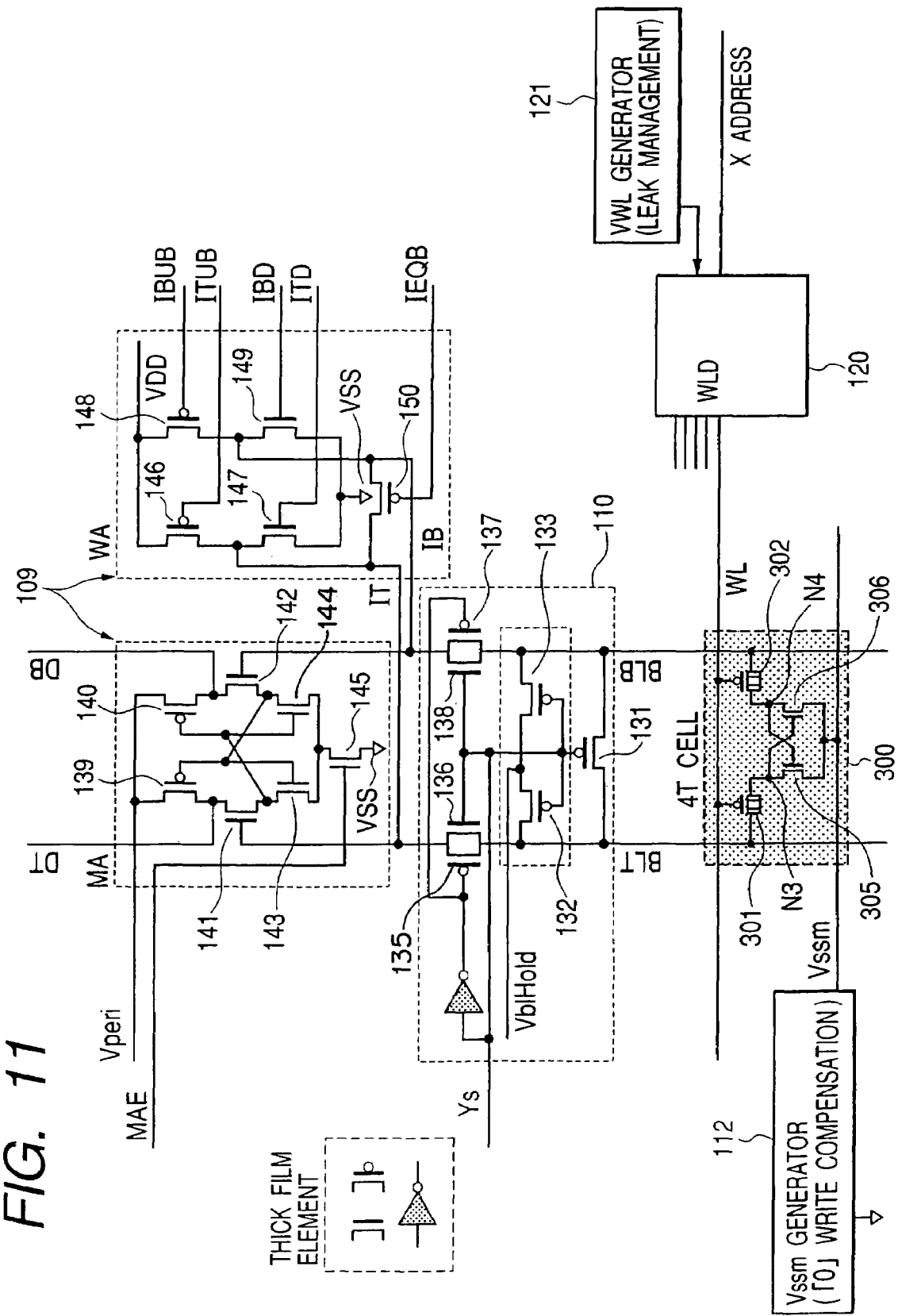
FIG. 11 is a circuit diagram illustrating a detailed configurational example of an SRAM macro included in the semiconductor integrated circuit shown in FIG. 10.

A configurational example of a principal part of the SRAM macro 107 is shown in FIG. 11.

The SRAM mat 111 includes a plurality of word lines, a plurality of bit lines provided so as to intersect the word lines, and a plurality of 4T cells respectively provided at points where the word lines and the bit lines intersect. Those each having the same configuration as the one shown in FIG. 3 are basically applied to the 4T cells. That is, n channel type MOS transistors 305 and 306 are connected to constitute a storage section. Source electrodes of the n channel type MOS transistors 305 and 306 are connected to a power supply Vssm on the low potential side. A point where a drain electrode of the n channel type MOS transistor 305 and a gate electrode of the n channel type MOS transistor 306 are connected to each other is configured as a first node N3 of the storage section. The first node N3 is connected to a bit line BLT via a p channel type MOS transistor 301. A point where a drain electrode of the n channel type MOS transistor 306 and a gate electrode of the n channel type MOS transistor 305 are connected to each other is configured as a second node N4 of the storage section.

The second node N4 is connected to a bit line BLB via a p channel type MOS transistor 302.

The p channel type MOS transistors 301 and 302 are operation-controlled by the potential of a word line WL. In the present example, when the word line WL is driven to a low level, the p channel type MOS transistors 301 and 302 are brought into conduction so that the first node N3 and the second node N4 of the storage section are respectively connected to the bit lines BLT and BLB, thus making it possible to write data into the storage section and read data from the storage section.

The p channel type MOS transistors 301 and 302 are configured as a vertical structure, such as shown in FIG. 4. The p channel type MOS transistor 301 is laminated over the n channel type MOS transistor 305, and the p channel type MOS transistor 302 is laminated over the n channel type MOS transistor 306, whereby a reduction in the area of the memory cell can be achieved.

The VSSM generator 112 is configured in a manner similar to the constant voltage circuit 93 shown in FIG. 9 by way of example, and it performs "0" write compensation.

The plurality of word lines WL are selectively driven by a word line driver (WLD) 120. The word line driver 120 decodes an input X (row) address signal and drives one corresponding to the X address from the plurality of word lines WL to a select level, based on the result of decoding. In the present example, since the p channel type MOS transistors 301 and 302 are applied as transfer MOSs in the 4T cell 300, the select level of the word line WL is brought to a low level, which is equal to a power supply VSS level on the low potential side.

A VWL generator 121 controls the drive potential level of each word line, based on the ratio between leakage currents of a p channel MOS transistor and an n channel type MOS transistor.

The complementary bit lines BLT and BLB are selectively connected to the main amplifier and write amplifier 109 via the column selection circuit 110. The main amplifier and write amplifier 109 include a main amplifier MA for amplifying a signal transmitted through the column selection circuit 110 and a write amplifier MA for supplying write data to the bit lines BLT and BLB through the column selection circuit 110.

The column selection circuit 110 is configured as follows:

A p channel type MOS transistor 135 and an n channel type MOS transistor 136 are connected in parallel to form a column switch. The bit line BLT is connected to the main amplifier MA and the write amplifier WA through the column switch. A p channel type MOS transistor 137 and an n channel type MOS transistor 138 are connected in parallel to form a column switch. The bit line BLB is connected to the main amplifier MA and the write amplifier WA through the column switch. There is further provided a precharge circuit for precharging each of the bit lines BLT and BLB to a predetermined voltage level. The precharge circuit comprises a p channel type MOS transistor 132 connected to the bit line BLT and a p channel type MOS transistor 133 connected to the bit line BLB, both of which are connected in series. A node where the p channel type MOS transistors 132 and 133 are connected in series is supplied with a precharge voltage VbHold of a predetermined level. A column select signal Ys is transferred to gate electrodes of the p channel type MOS transistors 132 and 133. When the column select signal Ys is asserted at a low level, the p channel type MOS transistors 132 and 133 are brought into conduction so that the bit lines BLT and BLB are precharged by the precharge voltage VbHold. A p channel type MOS transistor 131 for equalization is provided so as to short-circuit the bit lines BLT and BLB. When the column select signal Ys is asserted at a low level so that the bit lines BLT and BLB are supplied with the precharge voltage VbHold, the p channel type MOS transistor 131 for equalization is brought into conduction so that the bit lines BLT and BLB are made equal to each other in precharge level.

The main amplifier MA comprises p channel type MOS transistors 139 and 140, and n channel type MOS transistors 141, 142, 143, 144 and 145, all of which are connected to one another. A series-connected circuit of the MOS transistors 139, 141 and 143 and a series-connected circuit of the MOS transistors 140, 142 and 144 are connected in a loop form to form a latch circuit. Source electrodes of the p channel type MOS transistors 139 and 140 are supplied with a voltage Vperi. Source electrodes of the n channel type MOS transistors 143 and 144 are connected to the power supply VSS on the low potential side through the n channel type MOS transistor 145. A main amplifier enable signal MAE is transferred to a gate electrode of the n channel type MOS transistor 145. When the main amplifier enable signal MAE is asserted at a high level so that the n channel type MOS transistor 145 is brought into conduction, the main amplifier MA is brought to an enable or operable state.

The main amplifier WA comprises p channel type MOS transistors 146, 148 and 150, and n channel type MOS transistors 147 and 149, all of which are connected to one another. The p channel type MOS transistor 146 and the n channel type MOS transistor 147 are connected in series. A point where they are connected in series, is configured as a node IT, which is connected to the bit line BLT via the MOS transistors 135 and 136 of the column selection circuit 110. The p channel type MOS transistor 148 and the n channel type MOS transistor 149 are connected in series. A point where they are connected in series, is configured as a node IB, which is connected to the bit line BLB via the MOS transistors 137 and 138 of the column selection circuit 110. A gate electrode of the p channel MOS transistor 146 is supplied with a step-up control ITUB for the node IT. When the step-up control signal ITUB is asserted at a low level, the p channel type MOS transistor 146 is brought into conduction, so that a high voltage based on a power supply VDD on the high potential side is supplied to the node IT. A gate electrode of the p channel MOS transistor 148 is supplied with a step-up control signal IBUB for the node IB. When the step-up control signal IBUB is asserted at a low level, the p channel type MOS transistor 148 is brought into conduction so that a high voltage based on the power supply VDD on the high potential side is supplied to the node IB.

Source electrodes of the n channel type MOS transistors 147 and 149 are connected to the power supply VDSS on the low potential side. Gate electrodes of the n channel type MOS transistors 147 and 149 are supplied with write data ITD and IBD. The operations of the n channel type MOS transistors 147 and 149 are controlled in accordance with the write data ITD and IBD to enable data writing.

Further, a p channel type MOS transistor 150 is provided so as to short-circuit the nodes IT and IB. The nodes IT and IB are equalized in accordance with an equalize control signal IEQB transferred to a gate electrode of the p channel type MOS transistor 150.

Here, a cell read current and a leakage current are proportional to each other in the 4T cell 300. This means that a high speed operation and a low leakage are incompatible. That is, when the threshold voltage is lowered for the high speed operation to ensure a sufficient gate-to-source voltage Vgs, a large standby current flows. When the threshold voltage is made high to lower the drain-to-source voltage Vds in reverse, a small read current flows so that a low speed operation is enabled.

Although the cell VSS is raised in a standby mode to achieve a reduction in leakage current, there is a need to set each mode, and a frequent standby cannot be performed.

Thus, the SRAM macro 107 shown in FIG. 10 makes use of MOS transistors (thick film elements) that are high in threshold voltage. Then, Vb1 is lowered during a period other than reading to produce a low leakage state, and a bit line selected by a column selection system (Ys) is boosted or stepped up upon reading, thereby enabling a reduction in current consumption and high-speed reading of data.

That is, thick film elements (high-withstand MOS transistors) are applied to all the MOS transistors constituting the 4T cell 300, all the MOS transistors constituting the column selection circuit 110, all the MOS transistors constituting the write amplifier WA, and the MOS transistors 141 and 142 in the main amplifier MA, whereby their threshold voltages are set high, where a bit line precharge voltage Vb1 Hold is set low.

Figure 12:
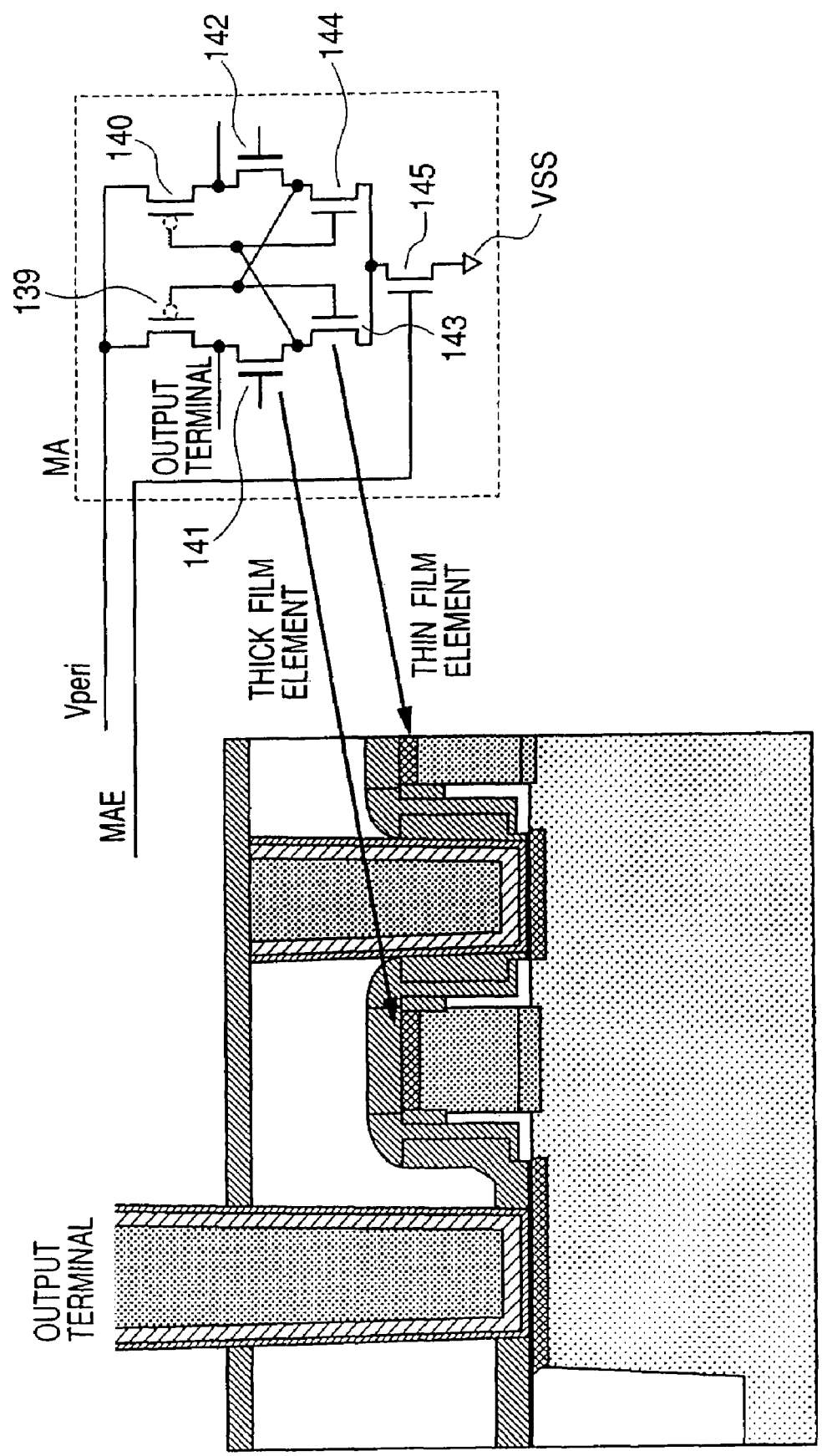
FIG. 12 is a diagram illustrating the relationship between a main amplifier included in the SRAM macro and a cross-section of a transistor included therein.

FIG. 12 typically shows a cross-sectional structure of a principal part of the main amplifier MA.

The main amplifier MA is configured as a portion where the VDD system is switched to the Vperi system. Only the n channel type MOS transistors 141 and 142 are configured as thick film elements, and the other MOS transistors are configured as thin film elements. The thickness of the oxide film of the gate of each thick film element is made to be thicker than that of the gate oxide film of the other MOS transistor, e.g., the thin film MOS transistor 143.

Using such thick film elements enables a reduction in standby current.

However, since only a small read current is obtained upon reading data from the 4T cell 300 if kept intact, time is taken to read the data. Therefore, in the present example, high voltage (power supply VDD on the high potential side) is supplied to the bit lines BLT, BLB each selected in accordance with the column select signal Ys through the nodes IT and IB to thereby raise the precharge levels of the bit lines. Consequently, the data can be read at high speed from the 4T cell 300. Even upon writing of data into the 4T cell 300, high voltage (power supply VDD on the high potential side) is supplied to the bit lines BLT and BLB via the nodes IT and IB in the same manner as described above, whereby the precharge levels of the bit lines are raised to achieve the speeding up of writing.

In the present example, as described above, high voltage (power supply VDD on the high potential side) is supplied via the nodes IT and IB to raise the precharge levels of the bit lines, whereby the reading of data from the 4T cell 300 at high speed is enabled. Thus, high-withstand MOS transistors are used at points where a voltage that is higher than the precharge voltage is supplied. In the configurational example shown in FIG. 11 by way of example, all the MOS transistors constituting the 4T cell 300, all the MOS transistors constituting the column selection circuit 110, all the MOS transistors constituting the write amplifier WA, and the MOS transistors 141 and 142 of the main amplifier MA are configured as high-withstand MOS transistors. At this time, ones identical in type to the high-withstand MOS transistors used in the input circuit 101 and output circuit 105 shown in FIG. 10 are used for the high-withstand MOS transistors used in the internal circuit. This is because the film thickness of each MOS transistor employed in a semiconductor integrated circuit is generally often limited to two types, and the high-withstand MOS transistors of the internal circuit can be formed within its range.

Figure 13:
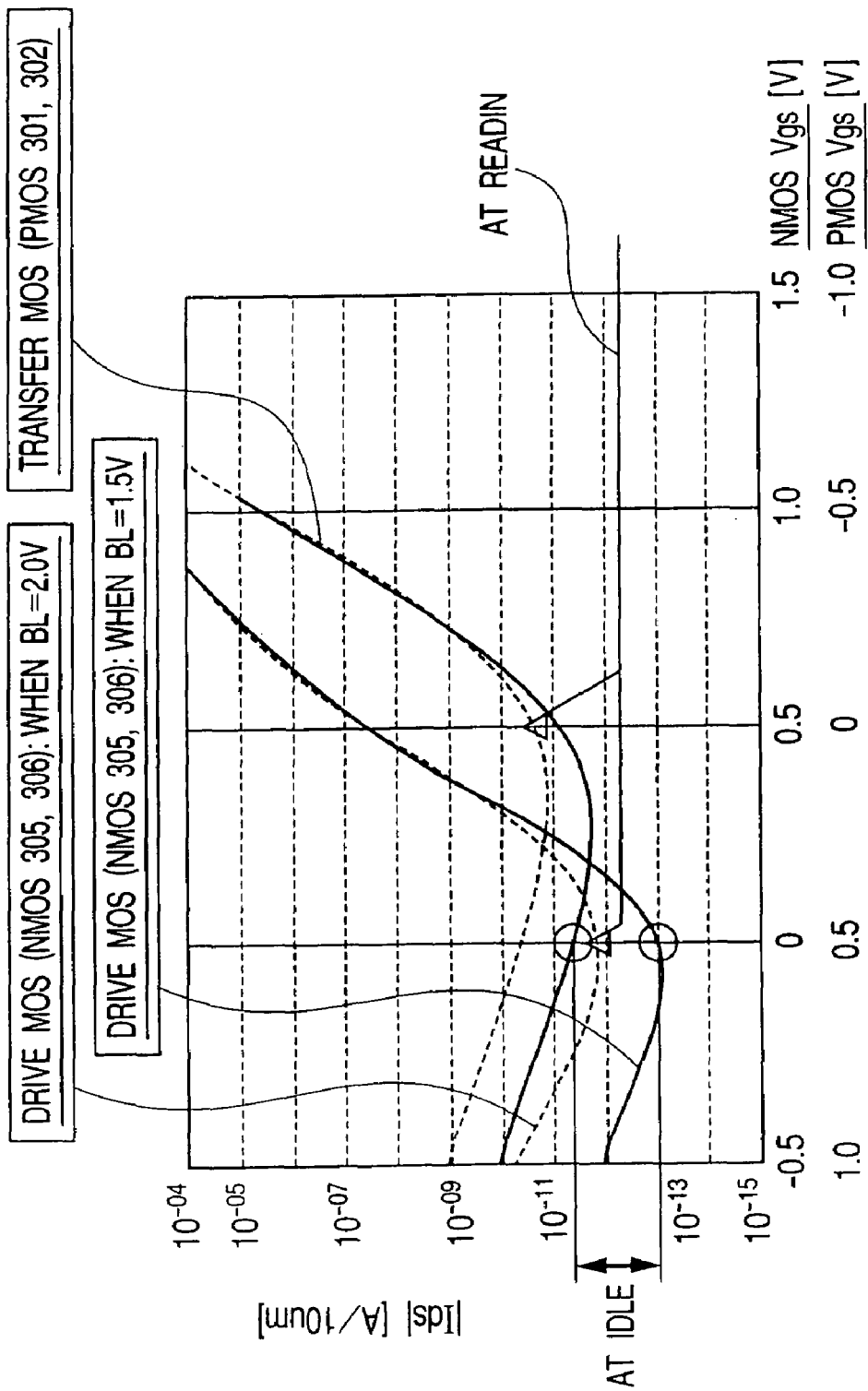
FIG. 13 is a graph illustrating leakage currents of a transfer MOS included in the SRAM macro and drive MOSs included therein.
Figure 14:
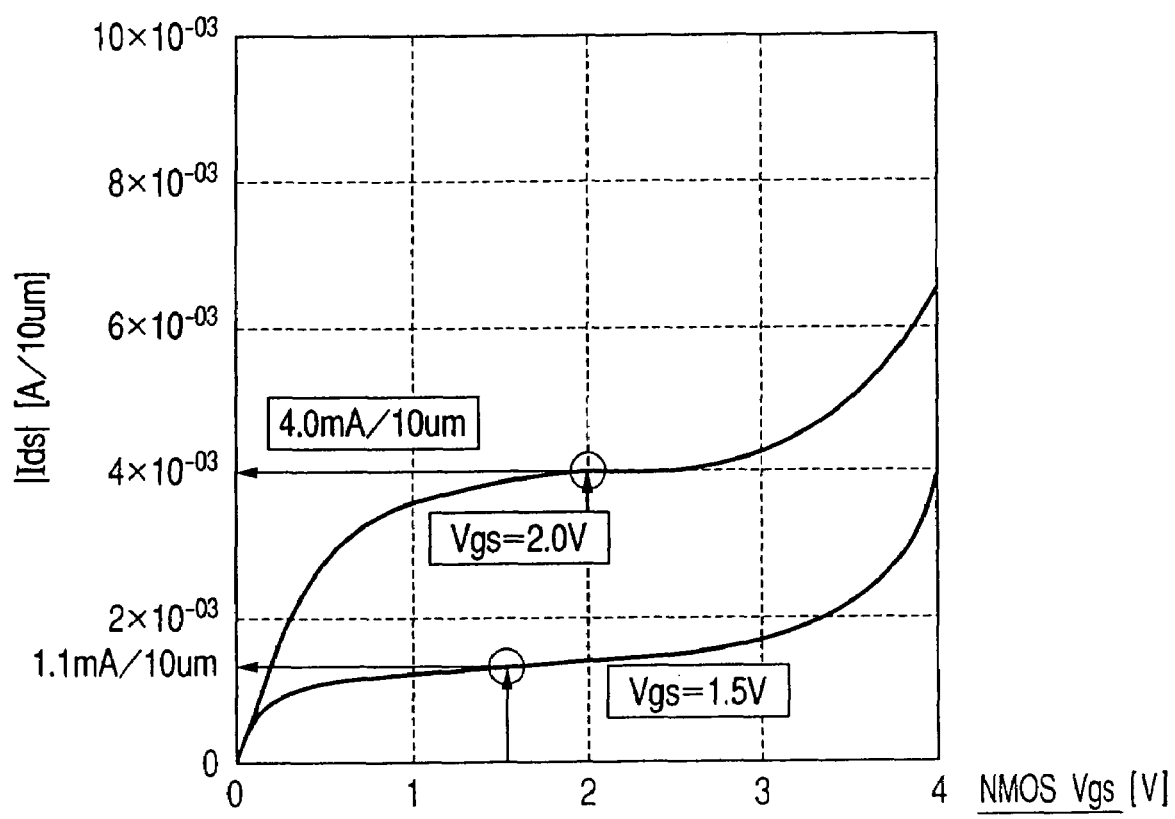
FIG. 14 is a graph illustrating ON current characteristics of the n channel MOS transistors included in the SRAM macro.

The leakage current characteristics of transfer MOSs (p channel type MOS transistors 301 and 302) and drive MOSs (n channel type MOS transistors 305 and 306) are shown in FIG. 13. The horizontal axis indicates a gate-to-source voltage of each MOS transistor, and the vertical axis indicates a drain-source current of each MOS transistor. The characteristic curves indicated by solid lines correspond to the case where the potential of each bit line BL=1.5V, whereas the characteristic curves indicated by broken lines correspond to the case where the potential of each bit line BL=2.0V. The ON current characteristics are illustrated in FIG. 14.

A potential opposite in polarity to a potential for turning on a channel is applied between the gate and source to increase leakage current. This is known as the GIDL (Gate Induced Drain Leakage) characteristic. In the present example, such a GIDL characteristic is used to retain or hold data. Incidentally, the GIDL characteristic of the MOS transistor has been described in, for example, "Ja-Hao, Chen, Shyh-Chyi Wong, and Yeong-Her Wang "An Analytic Three-Terminal Band-to-Band Tunneling Model on GIDL in MOSFET" IEEE TRANSACTIONS ON ELECTRON, VOL. 48, 7, JULY 2001".

Referring to FIG. 13, since the potential of the bit line BL=2.0V upon reading, a gate-to-source voltage Vgs of each transfer MOS results in −0.1V. Thus, the transfer MOS is held ON very weakly by the GIDL characteristic, and, hence the leakage current increases slighter more than usual. With the use of this mode, the restoration of each non-selected cell can be speeded up.

The retention of data is performed in a GIDL region of a p channel type MOS transistor. That is, each of the transistors is set so as to hold or retain data on the high level side in the storage section in a state in which a potential that is opposite in polarity to the potential for turning on the channel is being applied between the gate and source. This results for the following reasons.

That is, when the bit lines are boosted or stepped up, the potential of the corresponding word line is relatively reduced. Only some of all the non-selected memory cells on the same bit line are placed in a selected state so that a large current is used up. However, if a high level of data is retained using the GIDL region of the p channel type MOS transistor, then the leakage current need not increase, even if the potential of each bit line rises.

Thus, in the present example, the potential BL of the bit line is +0.4V (1.5V+0.4V=1.9V) and the gate-to-source voltage Vgs is given as a reverse bias of 0.4V at idle. Therefore, the word line WL retains a high level by use of the GIDL region. An off leakage current of each drive MOS (corresponding to each of n channel type MOS transistors 305 and 306) results in $10^{-13}$[A] if BL=1.5V. This current results in $\frac{1}{50}$ as compared with $5\times10^{-12}$ at BL=2.0V of a read voltage.

Since the standby current is set to 50 to 100 times the leakage current of the drive MOS, the standby current can be brought to $10^{-13}\times100=10^{-11}$ when BL=1.5V, and $\frac{1}{20}$ of $2\times10^{-12}\times100=2\times10^{-10}$ when BL=2.0V. When BL=2.0V is set, 4.0 mA is obtained with respect to 1.1 mA at BL=1.5V upon reading, so that an increase (speeding up) of 3.6 times is enabled.

Figure 15:
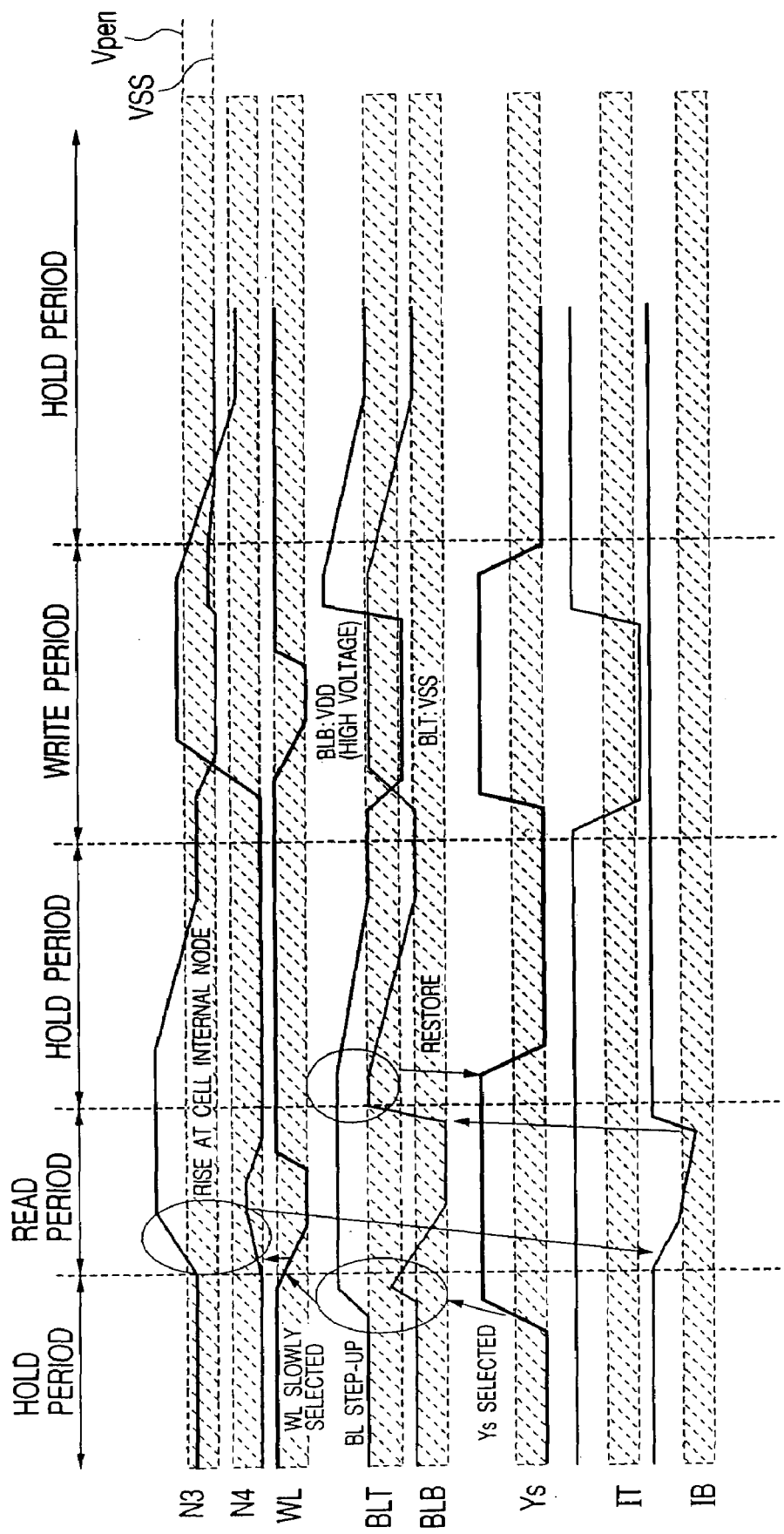
FIG. 15 is a waveform diagram showing operations of principal parts in the SRAM macro.

The operational waveforms of principal parts of the SRAM macro 107 shown in FIG. 11 are illustrated in FIG. 15. The hold periods, read periods and write periods are shown in the present example.

During the hold period, the bit lines are precharged by a low bit line precharge voltage Vb1 Hold to thereby reduce the cell leakage current.

During the read period, the power supply VDD on the high potential side is applied to the main amplifier MA and the write amplifier WA. Therefore, the potentials of the bit lines BLT and BLB selected by the column selection circuit 110 rise, and, correspondingly the driving force of the memory cell increases. After the completion of reading, the bit lines BLT and BLB are respectively brought to a high potential level so that cell restoration is performed.

When the bit lines BLT and BLB are respectively brought to a non-selected state during a hold period that is set immediately after the read period, the bit lines BLB/BLT are slowly restored to the original voltage level of Vb1 Hold.

Next, during a write period, the power supply VDD on the high potential side is applied to the main amplifier MA and the write amplifier WA in a manner similar to the read period. Therefore, the potentials of the bit lines BLT and BLB selected by the column selection circuit 110 rise, and, correspondingly, the driving force of the memory cell increases. After the completion of reading, the potentials of the bit lines BLT and BLB are made equal to the high potential, so that cell restoration is effected.

According to the above example, the following operation and effects can be obtained.

That is, the thick film elements are applied to all the MOS transistors constituting the 4T cell 300, all the MOS transistors constituting the column selection circuit 110, all the MOS transistors constituting the write amplifier WA, and the MOS transistors 141 and 142 of the main amplifier MA, whereby their threshold voltages are made high, while the bit line precharge voltage Vb1Hold is set low. It is thus possible to achieve a reduction in standby current. Upon reading, the high voltage (power supply VDD on the high potential side) is supplied to the bit lines BLT and BLB selected in accordance with the column select signal Ys via the nodes IT and IB to thereby raise the precharge levels of the bit lines, thus making it possible to read the data from the 4T cell 300 at high speed.

Even upon writing data into the 4T cell 300, high voltage (power supply VDD on the high potential side) is similarly supplied to the bit lines BLT and BLB via the nodes IT and IB to thereby raise the precharge levels of the bit lines, thus making it possible to achieve a speeding up of the data writing.

While the invention developed above by the present inventors has been described specifically with reference to the illustrated embodiments, the present invention is not limited to these embodiments. It is needless to say that various changes can be made thereto within a scope not departing from the substance thereof.

For instance, an FRAM (Ferroelectric RAM) area may be provided in place of the DRAM cell area 19 shown in FIG. 1. Nonvolatile memory cells, each having a ferroelectric film used in a capacitor for data retention, may be laid out in the FRAM area.

The main amplifier MA, the write amplifier WA, the column selection circuit 110, etc. shown in FIG. 11 can be applied to the mixed semiconductor memory device shown in FIG. 1.

While the above description has principally been directed to the case in which the invention made by the present inventors is applied to a semiconductor integrated circuit including an SRAM macro, which belongs to the field of application extending to the background of the invention, the present invention is not limited thereto, but can be widely applied to various semiconductor integrated circuits.

The present invention can be applied on the condition that at least the bit lines are included.

Advantageous effects obtained by a representative aspect of the invention disclosed in the present application will be described in brief as follows:

When a memory cell comprises first, second, third and fourth transistors, the third and fourth transistors are configured as a vertical structure, the third transistor is laminated over the first transistor, and the fourth transistor is laminated over the second transistor, whereby a reduction in cell area can be achieved. A voltage, which is set on the condition that the difference between a source potential applied to each of the first and second transistors and a select level of a word line is greater than or equal to a threshold voltage of each of the third and fourth transistors, is supplied to each of source electrodes of the first and second transistors, thereby to provide "0" write compensation, whereby the appropriateness of writing of a logical value "0" is achieved. High voltage precharge means performs precharge at a voltage higher than a precharge voltage from the bit line precharge circuit to thereby make it possible to achieve a reduction in standby current and a speeding up of reading and writing.

The invention claimed is:

1. A semiconductor memory device comprising:
   a first memory cell area in which first memory cells are disposed in an array form;
   a second memory cell area in which second memory cells different in structure from the first memory cells are disposed in an array form; and
   a peripheral circuit shared between the first memory cell area and the second memory cell area,
   wherein said each first memory cell includes:
   a storage section comprising an n channel type first MOS transistor and an n channel type second MOS transistor connected to each other;
   a p channel type third MOS transistor that is capable of connecting a drain electrode of the first MOS transistor and a gate electrode of the second MOS transistor to a first bit line; and
   a p channel type fourth MOS transistor that is capable of connecting a drain electrode of the second MOS transistor and a gate electrode of the first MOS transistor to the first bit line,
   wherein the third and fourth MOS transistors are configured as a vertical structure, the third MOS transistor is laminated over the first MOS transistor, and the fourth MOS transistor is laminated over the second MOS transistor,
   wherein said each second memory cell includes a storage section in which a first inverter comprising a p channel type fifth MOS transistor and an n channel type sixth MOS transistor, both connected in series, and a second inverter comprising a p channel type seventh MOS transistor and an n channel type eighth MOS transistor, both connected in series, are connected in a loop form, and
   wherein the fifth and seventh MOS transistors are configured as a vertical structure, the fifth MOS transistor is laminated over the sixth MOS transistor, and the seventh MOS transistor is laminated over the eighth MOS transistor.

2. The semiconductor memory device according to claim 1, wherein the array pitch between adjacent bit lines in the first memory cell array and the array pitch between adjacent bit lines in the second memory cell array are rendered equal to each other so as to share the bit lines between the first memory cell array and the second memory cell array.

3. The semiconductor memory device according to claim 1, wherein, when the bit line array pitches are different from each other between the first memory cell array and the second memory cell array, a selector for selectively connecting the bit lines is interposed between the bit lines of the first memory cell array and the bit lines of the second memory cell array.

4. The semiconductor memory device according to claim 1, wherein each of the third and fourth MOS transistors is set so as to retain data on the high level side in the storage section in a state in which a potential opposite in polarity to a potential for turning on a channel is being applied between a gate and source thereof.

5. The semiconductor memory device according to claim 2, wherein each of the third and fourth MOS transistors is set so as to retain data on the high level side in the storage section in a state in which a potential opposite in polarity to a potential for turning on a channel is being applied between a gate and source thereof.

6. The semiconductor memory device according to claim 3, wherein each of the third and fourth MOS transistors is set so as to retain data on the high level side in the storage section in a state in which a potential opposite in polarity to a potential for turning on a channel is being applied between a gate and source thereof.

* * * * *